US012742823B2

(12) United States Patent
Hatani et al.

(10) Patent No.: US 12,742,823 B2
(45) Date of Patent: Sep. 22, 2026

(54) VOLTAGE MEASUREMENT DEVICE

(71) Applicant: Nuvoton Technology Corporation Japan, Kyoto (JP)

(72) Inventors: Naohisa Hatani, Kyoto (JP); Goro Mori, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 333 days.

(21) Appl. No.: 18/456,273

(22) Filed: Aug. 25, 2023

(65) Prior Publication Data

US 2023/0400521 A1 Dec. 14, 2023

Related U.S. Application Data

(63) Continuation of application No. PCT/JP2022/009387, filed on Mar. 4, 2022.

(Continued)

(51) Int. Cl.
*H02J 7/90* (2026.01)
*G01R 19/00* (2006.01)
(Continued)

(52) U.S. Cl.
CPC .......... *H02J 7/933* (2026.01); *G01R 19/0084* (2013.01); *G01R 31/371* (2019.01);
(Continued)

(58) Field of Classification Search
CPC .. H02J 7/00712; H02J 7/00032; H02J 7/0013; H02J 7/0019; H02J 7/0047;
(Continued)

(56) References Cited

U.S. PATENT DOCUMENTS 6,020,717 A 2/2000 Kadouchi et al.
9,627,896 B2 * 4/2017 Nishihara ................ B60L 3/12
(Continued)

FOREIGN PATENT DOCUMENTS

CN 107234971 A 10/2017
CN 207311148 U 5/2018
(Continued)

OTHER PUBLICATIONS

Extended European Search Report dated Aug. 21, 2024 issued in the corresponding European Patent Application No. 22763424.3.

(Continued)

*Primary Examiner* — Tung S Lau
(74) *Attorney, Agent, or Firm* — Rimon P.C.

(57) ABSTRACT

A voltage measurement device includes a first measurement circuit that measures voltage between both ends of a busbar, a second measurement circuit that measures voltage between both ends of each of a plurality of first battery cells and a plurality of second battery cells, and a correction circuit that corrects a measurement value measured by the second measurement circuit. The second measurement circuit is connected to the plurality of first battery cells, the busbar, and the plurality of second battery cells via the plurality of second RC filters. The correction circuit corrects a measurement value measured by the second measurement circuit using a measurement value of voltage between both ends of the busbar measured by the first measurement circuit.

22 Claims, 5 Drawing Sheets

Related U.S. Application Data

(60) Provisional application No. 63/244,598, filed on Sep. 15, 2021, provisional application No. 63/157,251, filed on Mar. 5, 2021.

(51) Int. Cl.

| | |
|---|---|
| ***G01R 31/371*** | (2019.01) |
| ***G01R 31/3835*** | (2019.01) |
| ***G01R 31/396*** | (2019.01) |
| ***H01M 10/42*** | (2006.01) |
| ***H01M 10/48*** | (2006.01) |
| ***H01M 50/51*** | (2021.01) |
| ***H02J 7/40*** | (2026.01) |
| ***H02J 7/50*** | (2026.01) |
| ***H02J 7/56*** | (2026.01) |
| ***H02J 7/80*** | (2026.01) |

(52) U.S. Cl.
CPC ....... *G01R 31/3835* (2019.01); *G01R 31/396* (2019.01); *H01M 10/425* (2013.01); *H01M 10/482* (2013.01); *H01M 50/51* (2021.01); *H02J 7/40* (2026.01); *H02J 7/50* (2026.01); *H02J 7/56* (2026.01); *H02J 7/80* (2026.01); *H01M 2010/4271* (2013.01); *H01M 2010/4278* (2013.01); *H02J 2207/20* (2020.01)

(58) Field of Classification Search
CPC .. H02J 2207/20; H02J 2310/48; H02J 7/1423; G01R 19/0084; G01R 31/371; G01R 31/3835; G01R 31/396; G01R 31/392; H01M 10/425; H01M 10/482; H01M 50/51; H01M 2010/4271; H01M 2010/4278; H01M 10/42; H01M 10/48; Y02E 60/10
See application file for complete search history.

(56) References Cited

U.S. PATENT DOCUMENTS

| | | | | |
|---|---|---|---|---|
| 2008/0278115 | A1 | 11/2008 | Huggins | |
| 2009/0295398 | A1 | 12/2009 | Ohnuki | |
| 2010/0271223 | A1 * | 10/2010 | Ohkura | G01R 31/3842 340/636.13 |
| 2012/0025769 | A1 | 2/2012 | Kikuchi et al. | |
| 2012/0182024 | A1 * | 7/2012 | Ike | G01R 31/52 324/509 |
| 2012/0306506 | A1 | 12/2012 | Kiuchi | |
| 2015/0069974 | A1 | 3/2015 | Okada et al. | |
| 2017/0010329 | A1 | 1/2017 | Tang et al. | |
| 2019/0221893 | A1 | 7/2019 | Marsili et al. | |
| 2021/0313815 | A1 | 10/2021 | Kobayashi | |

FOREIGN PATENT DOCUMENTS

| | | | | |
|---|---|---|---|---|
| CN | 211223102 | U | 8/2020 | |
| CN | 111942216 | A | 11/2020 | |
| JP | 08-140204 | A | 5/1996 | |
| JP | 2011-185941 | A | 9/2011 | |
| JP | 2012-154641 | A | 8/2012 | |
| JP | 2013-219936 | A | 10/2013 | |
| JP | 2015-055503 | A | 3/2015 | |
| JP | 2015-141062 | A | 8/2015 | |
| JP | 2016-025794 | A | 2/2016 | |
| JP | 2018-194336 | A | 12/2018 | |
| JP | 2021-018070 | A | 2/2021 | |
| KR | 10-2019-0010003 | A | 1/2019 | |
| WO | WO 2016132895 | A1 * | 8/2016 | G01R 31/36 |
| WO | 2020/129577 | A1 | 6/2020 | |

OTHER PUBLICATIONS

Extended European Search Report dated Aug. 21, 2024 issued in the corresponding European Patent Application No. 22763425.0.

Extended European Search Report dated Aug. 12, 2024 issued in the corresponding European Patent Application No. 22763426.8.

International Search Report dated May 10, 2022 issued in International Patent Application No. PCT/JP2022/009387, with English translation.

International Search Report dated Apr. 26, 2022 issued in International Patent Application No. PCT/JP2022/009389, with English translation.

International Search Report dated May 10, 2022 issued in International Patent Application No. PCT/JP2022/009390, with English translation.

International Search Report dated Apr. 26, 2022 issued in International Patent Application No. PCT/JP2022/009391, with English translation.

International Search Report dated Oct. 25, 2022 issued in International Patent Application No. PCT/JP2022/034446, with English translation.

Non-Final Office Action dated Nov. 5, 2025 issued in related U.S. Appl. No. 18/456,299.

* cited by examiner

10a
Battery module system
12a
Voltage measurement device
61
First average filter
Measurement value
37
Diagnostic circuit
Diagnostic result
38
Timing control circuit
31
First measurement circuit
V112
V111
V123
V121
V122
36
Memory circuit
62
Second average filter
33
Correction circuit
Corrected value
35
Switch control circuit
32
Second measurement circuit
V212
V211
V223
V221
V222
34
Switch circuit
362
361
360
371
372
513
512
511
521
522
523
413
412
411
421
422
423
21
212
211
23
221
222
22

VOLTAGE MEASUREMENT DEVICE

CROSS REFERENCE TO RELATED APPLICATIONS

This is a continuation application of PCT International Application No. PCT/JP2022/009387 filed on Mar. 4, 2022, designating the United States of America, which is based on and claims priority of U.S. Provisional Patent Application No. 63/157,251 filed on Mar. 5, 2021, and U.S. Provisional Patent Application No. 63/244,598 filed on Sep. 15, 2021. The entire disclosures of the above-identified applications, including the specifications, drawings, and claims are incorporated herein by reference in their entirety.

FIELD

The present disclosure relates to voltage measurement devices.

BACKGROUND

A conventional voltage measurement device used in a battery module system including a battery module is known (see, for example, Patent Literature (PTL) 1). A battery module includes a plurality of battery cells connected in series. The voltage measurement device is connected to each battery cell via RC filters and measures the voltage between both ends of each battery cell. A cell balance switch is connected in parallel between both ends of each battery cell. The voltage between both ends of each of the plurality of battery cells is equalized by controlling the cell balance switches based on the voltage between both ends of each battery cell measured by the voltage measurement device.

CITATION LIST

Patent Literature

PTL 1: Japanese Unexamined Patent Application Publication No. 2015-141062

SUMMARY

Technical Problem

When a battery module system includes a plurality of battery modules connected in series, the battery modules are connected to each other with busbars. When cell voltages of the plurality of battery modules are measured using a single voltage measurement device, cell balance switches are also connected in parallel with the busbars. When a load is connected to the battery modules and current flows through the battery modules, current also flows through the busbars. Therefore, due to the electrical resistance of the busbars, a voltage is applied to the busbars. The voltage applied to the busbars is also applied to the RC filters and cell balance switches. The cell balance switches connected to the busbars are normally kept in the off state, but current can flow through the body diodes of the switching transistors that form the cell balance switches. In other words, current can flow through the RC filters and the cell balance switches connected in parallel with the busbars.

Here, an RC filter connected in parallel with a busbar is also used as part of the voltage measurement circuit of a battery cell directly connected to the busbar (i.e., adjacent to the busbar). The current flowing through the RC filter causes a voltage drop in the resistive component of the RC filter. This results in an error, equal to the amount of the voltage drop, in the measurement value of the voltage of a battery cell directly connected to the busbar. There is a possibility that the voltage measurement device may not detect any anomalies in the battery cell's voltage due to such an error in the measurement value.

The present disclosure overcomes this problem and has an object to provide a voltage measurement device that can accurately measure battery cell voltage.

Solution to Problem

In order to overcome the above-described problem, a voltage measurement device according to one aspect of the present disclosure is a voltage measurement device for use in a battery module system including: a first battery module including a plurality of first battery cells connected in series; a busbar connected in series with the first battery module; a second battery module connected in series with the first battery module via the busbar and including a plurality of second battery cells connected in series; and a plurality of first RC filters and a plurality of second RC filters connected to at least one of the first battery module, the busbar, or the second battery module. The voltage measurement device includes: a first measurement circuit that measures voltage between both ends of the busbar; a second measurement circuit that measures voltage between both ends of each of the plurality of first battery cells and the plurality of second battery cells; and a correction circuit that corrects a measurement value measured by the second measurement circuit. The second measurement circuit is connected to the plurality of first battery cells, the busbar, and the plurality of second battery cells via the plurality of second RC filters. The correction circuit corrects a measurement value measured by the second measurement circuit using a measurement value of voltage between both ends of the busbar measured by the first measurement circuit.

In order to overcome the above-described problem, a voltage measurement device according to one aspect of the present disclosure is a voltage measurement device for use in a battery module system including: a first battery module including a plurality of first battery cells connected in series; a busbar connected in series with the first battery module; a second battery module connected in series with the first battery module via the busbar and including a plurality of second battery cells connected in series; and a plurality of first RC filters and a plurality of second RC filters connected to at least one of the first battery module, the busbar, or the second battery module. The voltage measurement device includes: a first measurement circuit that measures voltage between both ends of each of the plurality of first battery cells, the busbar, and the plurality of second battery cells; a second measurement circuit that measures voltage between both ends of each of the plurality of first battery cells, the busbar, and the plurality of second battery cells; and a correction circuit that corrects a measurement value measured by the first measurement circuit. A different one of the plurality of first RC filters is connected to each of anodes of the plurality of first battery cells and the plurality of second battery cells and each of connection points between the busbar and the first battery module. A different one of the plurality of second RC filters is connected to each of cathodes of the plurality of first battery cells and the plurality of second battery cells and each of connection points between the busbar and the second battery module. The first measurement circuit is connected to the plurality of first battery cells, the busbar, and the plurality of second battery cells via the plurality of first RC filters. The correction circuit corrects a measurement value measured by the first measurement circuit using a measurement value of voltage between both ends of the busbar measured by the first measurement circuit.

Advantageous Effects

The present disclosure provides a voltage measurement device that can accurately measure battery cell voltage.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, embodiments of the present disclosure will be described with reference to the drawings. Each of the following embodiments shows a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. Elements that are essentially the same share like reference signs in the figures, and duplicate description is omitted or simplified.

Embodiment 1

The voltage measurement device and the battery module system according to Embodiment 1 will be described.

1-1. Overall Configuration

Figure 1:
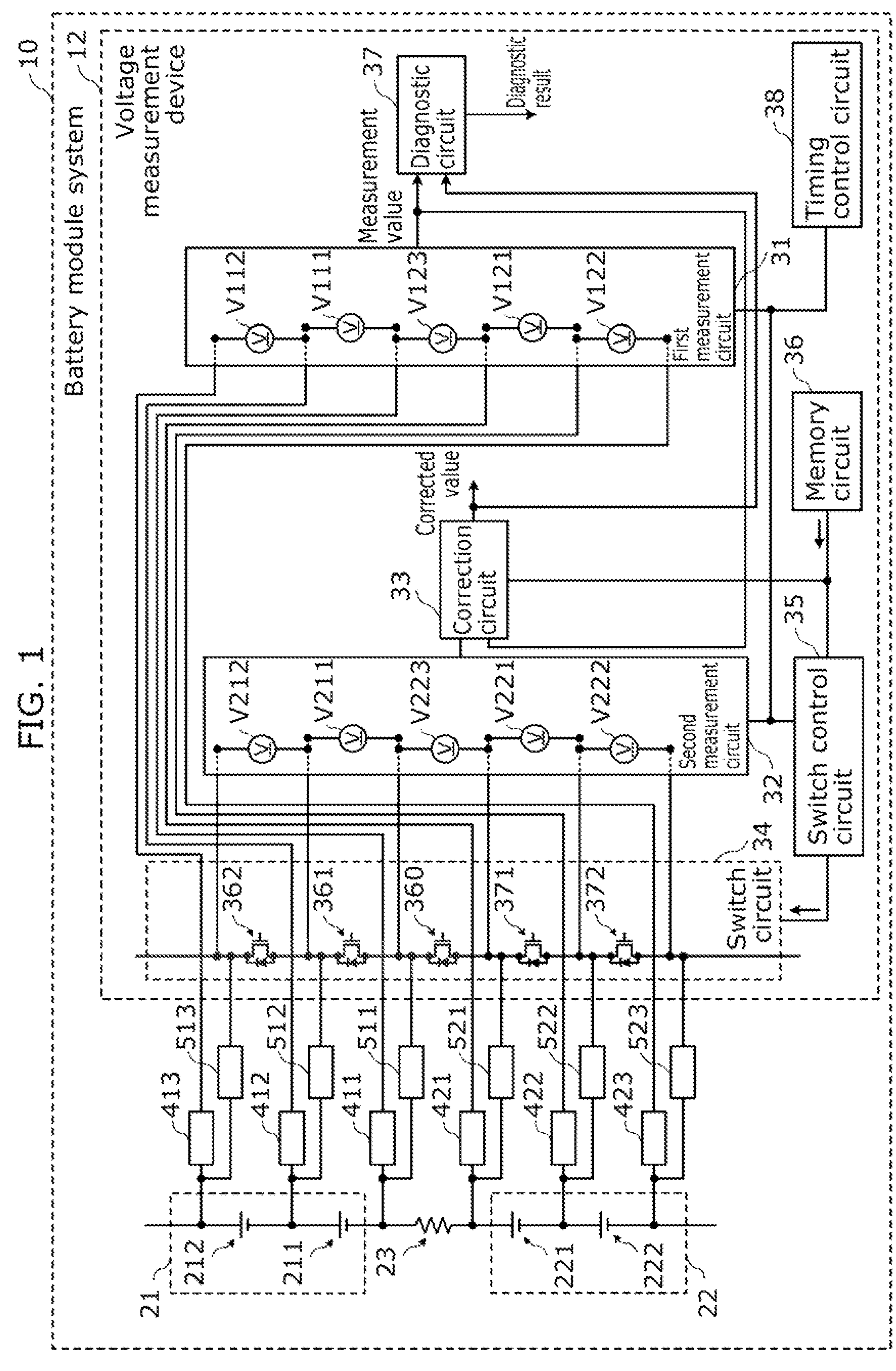
FIG. 1 is a circuit diagram illustrating the overall configuration of a battery module system according to Embodiment 1.

The overall configuration of the battery module system including the voltage measurement device according to the present embodiment will be described with reference to FIG. 1. FIG. 1 is a circuit diagram illustrating the overall configuration of battery module system 10 according to the present embodiment.

Battery module system 10 according to the present embodiment includes a plurality of battery modules connected in series. As illustrated in FIG. 1, battery module system 10 includes first battery module 21, second battery module 22, busbar 23, first RC filters 411 through 413 and 421 through 423, second RC filters 511 through 513 and 521 through 523, and voltage measurement device 12.

First battery module 21 includes a plurality of first battery cells 211 and 212 connected in series. First battery cells 211 and 212 are, for example, lithium-ion batteries.

Second battery module 22 includes a plurality of second battery cells 221 and 222 connected in series. Second battery module 22 is connected in series with first battery module 21 via busbar 23. Second battery cells 221 and 222 are, for example, lithium-ion batteries.

Busbar 23 is a conductive member that is connected in series with first battery module 21. Busbar 23 includes a resistive component. In the present embodiment, one terminal of busbar 23 is connected to the cathode of first battery cell 211 included in first battery module 21, and the other terminal of busbar 23 is connected to the anode of second battery cell 221 included in second battery module 22.

Each of first RC filters 411 through 413 and 421 through 423 and second RC filters 511 through 513 and 521 through 523 includes a resistive component and a capacitive component. Each of first RC filters 411 through 413 and 421 through 423 and second RC filters 511 through 513 and 521 through 523 is connected to at least one of first battery module 21, busbar 23, or second battery module 22. More specifically, a different one of first RC filters 411 through 413 and 421 through 423 and a different one of second RC filters 511 through 513 and 521 through 523 are connected to each of the connection points of first battery cells 211 and 212, busbar 23, and second battery cells 221 and 222, which are connected in series. First RC filter 413 and second RC filter 513 are connected to the anode of first battery cell 212. First RC filter 412 and second RC filter 512 are connected to the connection point between the cathode of first battery cell 212 and the anode of first battery cell 211. First RC filter 411 and second RC filter 511 are connected to the connection point between the cathode of first battery cell 211 and busbar 23. First RC filter 421 and second RC filter 521 are connected to the connection point between busbar 23 and the anode of second battery cell 221. First RC filter 422 and second RC filter 522 are connected to the connection point between the cathode of second battery cell 221 and the anode of second battery cell 222. First RC filter 423 and second RC filter 523 are connected to the cathode of second battery cell 222.

Figure 2:
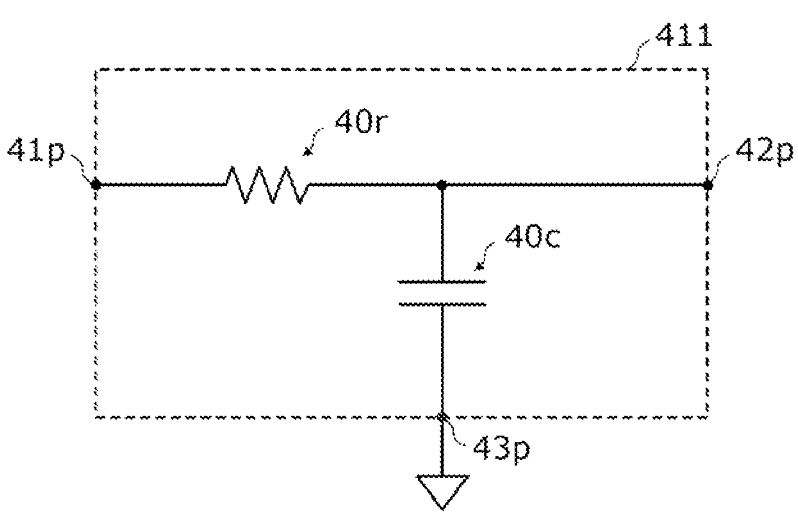
FIG. 2 is a circuit diagram illustrating the configuration of a first RC filter according to Embodiment 1.
Figure 3:
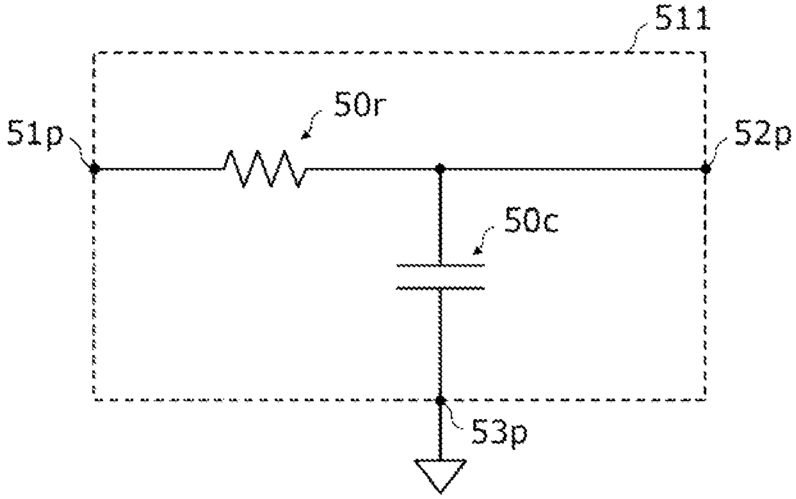
FIG. 3 is a circuit diagram illustrating the configuration of a second RC filter according to Embodiment 1.

The configuration of each first RC filter and each second RC filter will be described with reference to FIG. 2 and FIG. 3. FIG. 2 and FIG. 3 are circuit diagrams illustrating the configurations of first RC filter 411 and second RC filter 511 according to the present embodiment, respectively.

As illustrated in FIG. 2, first RC filter 411 includes first resistor 40*r* and first capacitor 40*c*. First resistor 40*r* is connected between terminals 41*p* and 42*p*. First capacitor 40*c* is connected between terminals 42*p* and 43*p*. In the present embodiment, terminal 41*p* is connected to the connection point between the cathode of first battery cell 211 and busbar 23 illustrated in FIG. 1, terminal 42*p* is connected to voltage measurement device 12, and terminal 43*p* is grounded. In the present embodiment, first RC filters 412, 413, and 421 through 423 have the same configuration as first RC filter 411.

As illustrated in FIG. 3, second RC filter 511 includes second resistor 50*r* and second capacitor 50*c*. Second resistor is connected between terminals 51*p* and 52*p*. Second capacitor 50*c* is connected between terminals 52*p* and 53*p*. In the present embodiment, terminal 51*p* is connected to the connection point between the cathode of first battery cell 211 and busbar 23 illustrated in FIG. 1, terminal 52*p* is connected to voltage measurement device 12, and terminal 53*p* is grounded. In the present embodiment, second RC filters 512, 513, and 521 through 523 have the same configuration as second RC filter 511.

In the present embodiment, the capacitor of each RC filter is exemplified as, but need not necessarily be grounded. For example, terminal 43*p*, to which first capacitor 40*c* is connected, and terminal 53*p*, to which second capacitor 50*c* is connected, may be connected to a terminal to which another RC filter is connected, etc., without being grounded.

Voltage measurement device 12 is a device used in battery module system 10. Voltage measurement device 12 measures the voltage between both ends of each battery cell included in first battery module 21 and second battery module 22, as well as the voltage between the both ends of busbar 23. Voltage measurement device 12 includes, for example, a multi-channel input and high-breakdown-voltage voltage measurement IC, and collects measurement voltages from a microcontroller or the like and controls cell balance switches. A microcontroller is a single-chip semiconductor integrated circuit including memory such as ROM and/or RAM in which a program is stored, a processor (central processing unit (CPU)) that executes the program, a timer, and input/output circuitry including an A/D converter and/or a D/A converter.

As illustrated in FIG. 1, voltage measurement device 12 includes first measurement circuit 31, second measurement circuit 32, switch circuit 34, and correction circuit 33. In the present embodiment, voltage measurement device 12 further includes switch control circuit 35, memory circuit 36, diagnostic circuit 37, and timing control circuit 38.

First measurement circuit 31 is a circuit that measures the voltage between both ends of each of first battery cells 211 and 212, busbar 23, and second battery cells 221 and 222. First measurement circuit 31 is connected to first battery cells 211 and 212, busbar 23, and second battery cells 221 and 222 via the first RC filters 411 through 413 and 421 through 423.

Second measurement circuit 32 is a circuit that measures the voltage between both ends of each of first battery cells 211 and 212, busbar 23, and second battery cells 221 and 222. Second measurement circuit 32 is connected to first battery cells 211 and 212, busbar 23, and second battery cells 221 and 222 via the second RC filters 511 through 513 and 521 through 523.

Switch circuit 34 includes cell balance switches 360 through 362, 371, and 372. Each cell balance switch is a switch used to equalize the voltage between both ends of each battery cell. For example, a metal-oxide-semiconductor field-effect transistor (MOSFET) can be used as each cell balance switch. Each cell balance switch is controlled by switch control circuit 35. In the present embodiment, cell balance switch 360 is connected in parallel with busbar 23 via second RC filters 511 and 521 connected to busbar 23. Cell balance switch 361 is connected in parallel with first battery cell 211 via second RC filters 511 and 512 connected to first battery cell 211. Cell balance switch 362 is connected in parallel with first battery cell 212 via second RC filters 512 and 513 connected to first battery cell 212. Cell balance switch 371 is connected in parallel with second battery cell 221 via second RC filters 521 and 522 connected to second battery cell 221. Cell balance switch 372 is connected in parallel with second battery cell 222 via second RC filters 522 and 523 connected to second battery cell 222.

Switch control circuit 35 is a circuit that controls each cell balance switch included in switch circuit 34. Switch control circuit 35 controls each cell balance switch to equalize the voltage between both ends of each battery cell.

Correction circuit 33 is a circuit that corrects voltage measurement values. In the present embodiment, correction circuit 33 corrects measurement values measured by second measurement circuit 32. More specifically, correction circuit 33 corrects a measurement value measured by second measurement circuit 32 using a measurement value of the voltage between both ends of busbar 23 measured by first measurement circuit 31. Details regarding the correction method will be described later.

Memory circuit 36 is a circuit that stores information to be used in voltage measurement device 12. In the present embodiment, memory circuit 36 stores the position at which busbar 23 is connected. More specifically, memory circuit 36 stores that busbar 23 is connected in parallel with cell balance switch 360. This position information is used in switch control circuit 35 and correction circuit 33.

Diagnostic circuit 37 is a circuit that compares a measurement value measured by first measurement circuit 31 and the measurement value corrected by correction circuit 33 (i.e., the corrected value). Diagnostic circuit 37 outputs a diagnostic result based on the comparison. For example, if the measurement value measured by first measurement circuit 31 and the measurement value corrected by correction circuit 33 are different, diagnostic circuit 37 outputs a diagnostic result indicating that at least one of first measurement circuit 31 and second measurement circuit 32 is anomalous. If the measurement value measured by first measurement circuit 31 and the measurement value corrected by correction circuit 33 are identical, diagnostic circuit 37 outputs a diagnostic result indicating that first measurement circuit 31 and second measurement circuit 32 are normal. Diagnostic circuit 37 configured in this manner can detect and report anomalies in voltage measurement device 12.

Timing control circuit 38 is a circuit that synchronizes the timing at which first measurement circuit 31 measures the voltage between both ends of busbar 23 and at least one of (i) the timing at which second measurement circuit 32 measures the voltage between both ends of first battery cell 211, which is the first battery cell that is directly connected to busbar 23 among first battery cells 211 and 212, or (ii) the timing at which second measurement circuit 32 measures the voltage between both ends of second battery cell 221, which is the second battery cell that is directly connected to busbar 23 among second battery cells 221 and 222. For example, timing control circuit 38 outputs trigger pulse signals to first measurement circuit 31 and second measurement circuit 32 simultaneously to synchronize the timing of the measurements.

1-2. Measurement Value Correction Method

Next, the method of correcting the measurement value of the voltage between both ends of each battery cell in voltage measurement device 12 according to the present embodiment will be described.

As mentioned above, because busbar 23 includes a resistive component, when a load is connected to battery module system 10 and current flows through each battery module and busbar 23, a voltage drop occurs in busbar 23. In this case, the electric potential at the connection point between busbar 23 and second battery cell 221 is higher than the electric potential at the connection point between busbar 23 and first battery cell 211. Voltage is therefore applied to second RC filter 521, cell balance switch 360, and second RC filter 511. Accordingly, current flows through second RC filter 521, the body diode of cell balance switch 360, and second RC filter 511. This causes a voltage drop in second resistors 50*r* of second RC filters 511 and 521.

Here, second RC filter 511 is included in the circuit used for the measurement by second measurement circuit 32 of the voltage between both ends of first battery cell 211 that is directly connected to busbar 23. This results in an error in the measurement value of the voltage of first battery cell 211 (measurement value V211 illustrated in FIG. 1) due to the voltage drop in second resistor 50*r* of second RC filter 511.

Similarly, second RC filter 521 is included in the circuit used for the measurement of the voltage between both ends of second battery cell 221 that is directly connected to busbar 23. This results in an error in the measurement value of the voltage of second battery cell 221 (measurement value V221 illustrated in FIG. 1) due to the voltage drop in second resistor 50*r* of second RC filter 521.

The measurement values measured by second measurement circuit 32 of each battery cell that is not directly connected to busbar 23 (measurement values V212 and V222 illustrated in FIG. 1) do not contain errors.

As described above, measurement value V211 measured by second measurement circuit 32, which measures the voltage of first battery cell 211 via second RC filter 511, can contain errors. Moreover, measurement value V221 measured by second measurement circuit 32, which measures the voltage of second battery cell 221 via second RC filter 521, can contain errors.

However, although the measurement values measured by first measurement circuit 31 (V111, V112, and V121 through V123 illustrated in FIG. 1) do not contain errors, the measurement values measured by second measurement circuit 32 must also be accurate to ensure the redundancy of the voltage measurement function of voltage measurement device 12.

In the present embodiment, measurement values measured by second measurement circuit 32 are corrected by correction circuit 33. As mentioned above, measurement value V211 of the voltage between both ends of first battery cell 211 is measured by second measurement circuit 32 to be lower than the actual (i.e., true) voltage value V11 between both ends of first battery cell 211 by the amount of voltage drop V511 in second resistor 50*r* of second RC filter 511. Here, voltage drop V511 is defined as a positive value when the electric potential is higher on the voltage measurement device 12 side than on the cathode side of first battery cell 211 to which second RC filter 511 is connected, and a negative value when the electric potential is lower on the voltage measurement device 12 side than on the cathode side of first battery cell 211. In the present embodiment, voltage drop V511 is a negative value.

Therefore, the following equation holds true between measurement value V211 of the voltage between both ends of first battery cell 211 in second measurement circuit 32, actual voltage V11 between both ends of first battery cell 211, and voltage drop V511.

$$V211 = V11 + V511$$

Similarly, the following equation holds true between measurement value V221 of the voltage between both ends of second battery cell 221 in second measurement circuit 32, actual voltage value V21 between both ends of second battery cell 221, and voltage drop V521 in second resistor 50*r* of second RC filter 521.

$$V221 = V21 + V521$$

Here, voltage drop V521 is defined as a positive value when the electric potential is lower on the voltage measurement device 12 side than on the anode side of second battery cell 221 to which second RC filter 521 is connected, and a negative value when the electric potential is lower on the voltage measurement device 12 side than on the cathode side of first battery cell 211.

The following equation holds true between measurement value V223 of the voltage between both ends of busbar 23 in second measurement circuit 32 and actual voltage value V23 between both ends of busbar 23.

$$V223 = V23 - V511 - V521$$

Actual voltage value V23 between both ends of busbar 23 is equal to measurement value V123 of the voltage between both ends of busbar 23 measured by first measurement circuit 31.

Here, since second RC filter 511 and second RC filter 521 have the same configuration, voltage drop V511 and voltage drop V521 are equal.

From the above, voltage values V11 and V21 are expressed by the following equations.

$$V11 = V211 - 0.5 \times (V123 - V223)$$

$$V21 = V221 - 0.5 \times (V123 - V223)$$

Correction circuit 33 uses these relational expressions to calculate corrected values of measurement values V211 and V221.

As described above, according to the present embodiment, correction circuit 33 calculates correction amount 0.5×(V123–V223) based on measurement value V123 of the voltage between both ends of busbar 23 measured by first measurement circuit 31 and measurement value V223 of the voltage between both ends of the busbar measured by second measurement circuit 32. Correction circuit 33 subtracts the correction amount from the measurement values, measured by second measurement circuit 32, of the voltage between both ends of first battery cell 211, which is the first battery cell that is directly connected to busbar 23 among first battery cells 211 and 212, and the voltage between both ends of second battery cell 221, which is the second battery cell that is directly connected to busbar 23 among second battery cells 221 and 222. The configuration of correction circuit 33 is not limited to this example. For example, correction circuit 33 may set the correction amount as 0.5×(V223–V123) (i.e., invert the sign of the correction amount) and add (instead of subtract) the correction amount to the measurement value measured by second measurement circuit 32.

As described above, voltage measurement device 12 according to the present embodiment can accurately measure the voltages of first battery cell 211 and second battery cell 221 that are directly connected to busbar 23 by using correction circuit 33 to correct the measurement values measured by second measurement circuit 32.

Cell balance switch 360, which is connected in parallel with busbar 23, may be kept in the on state by switch control circuit 35. This inhibits current from flowing through the body diode of cell balance switch 360, thereby inhibiting the destruction of cell balance switch 360 by this current.

Thus, when cell balance switch 360 is kept in the on state, measurement value V223 measured by second measurement circuit 32 can be ignored if the resistive component in cell balance switch 360 is small enough to be ignored. Accordingly, in this case, voltage values V11 and V21 are expressed by the following equations.

$$V11 = V211 - 0.5 \times V123$$

$$V21 = V221 - 0.5 \times V123$$

Correction circuit 33 may use these relational expressions to calculate corrected values of measurement values V211 and V221. Stated differently, correction circuit 33 may calculate the correction amount (0.5×V123) based on the measurement value of the voltage between both ends of busbar 23 measured by first measurement circuit 31. This allows for simpler correction.

In the present embodiment, timing control circuit 38 synchronizes the timing at which first measurement circuit 31 measures the voltage between both ends of busbar 23, the timing at which second measurement circuit 32 measures the voltage between both ends of first battery cell 211, and the timing at which second measurement circuit 32 measures the voltage between both ends of second battery cell 221. This enables highly accurate measurement even when the current flowing in each battery cell and busbar 23 fluctuates over time.

1-3. Busbar Position Detection

Figure 4:
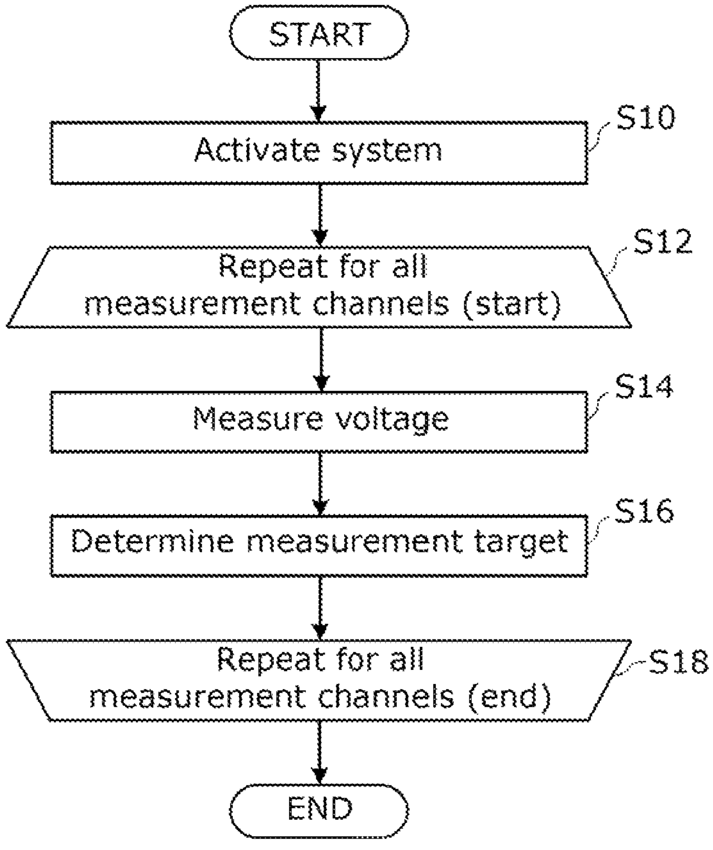
FIG. 4 is a flowchart illustrating a method of detecting the position of a busbar according to Embodiment 1.

As mentioned above, the position of busbar 23 may be stored in memory circuit 36, but first measurement circuit 31 and second measurement circuit 32 can also detect the position of busbar 23. Hereinafter, a method of detecting the position of busbar 23 using first measurement circuit 31 and second measurement circuit 32 will be described with reference to FIG. 4. FIG. 4 is a flowchart illustrating a method of detecting the position of busbar 23 according to the present embodiment.

As illustrated in FIG. 4, first, battery module system 10 is activated (activation step S10).

Next, the following steps are repeated for all measurement channels of first measurement circuit 31 and second measurement circuit 32 (S12).

The voltage of one channel of first measurement circuit 31 and second measurement circuit 32 is measured (measurement step S14).

Next, the measurement target connected to the channel is determined based on the measurement value in the measurement step S14 (determination step S16). More specifically, if the measurement value is a positive value, a battery cell is determined to be connected to the measurement channel, if the measurement value is a negative value, busbar 23 is determined to be connected to the measurement channel, and if the measurement value is zero, neither a battery cell nor a busbar is determined to be connected to the measurement channel (i.e., the measurement channel is determined to be an empty channel).

The above measurement step S14 and determination step S16 are repeated for all measurement channels (S18).

As described above, according to the present embodiment, at least one of first measurement circuit 31 or second measurement circuit 32 may detect the location at which busbar 23 is connected based on the measurement values of voltage between both ends of each of the plurality of first battery cells, busbar 23, and the plurality of second battery cells. This allows voltage measurement device 12 to detect the position of busbar 23 without having to store the position of busbar 23 in memory circuit 36.

Embodiment 2

The voltage measurement device and the battery module system according to Embodiment 2 will be described. The voltage measurement device according to the present embodiment differs from voltage measurement device 12 according to Embodiment 1 in that it includes an average filter that averages measurement values, and is identical in other respects. Hereinafter, the voltage measurement device and the battery module system according to the present embodiment will be described with reference to FIG. 5, focusing on the differences from voltage measurement device 12 and battery module system according to Embodiment 1.

Figure 5:
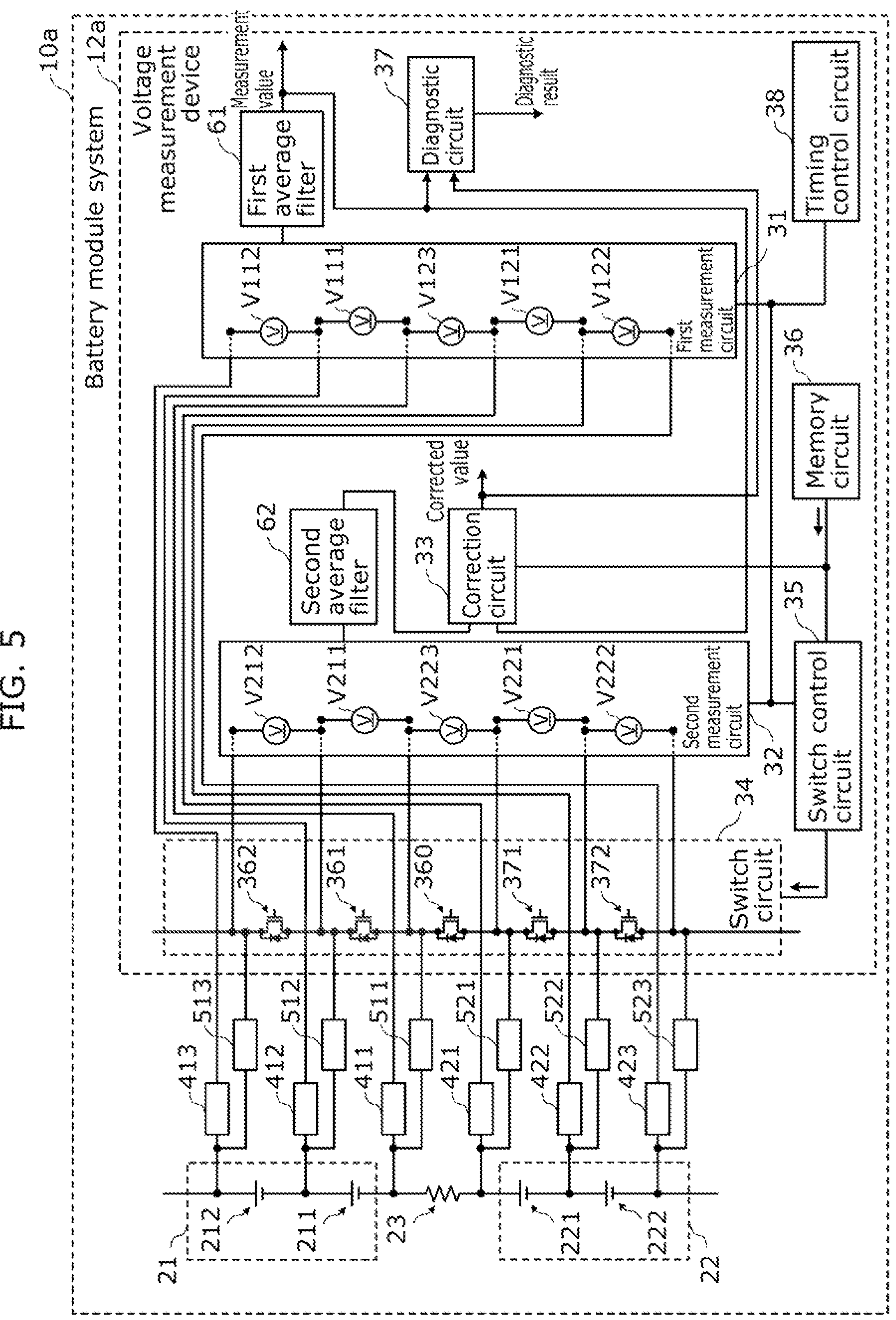
FIG. 5 is a circuit diagram illustrating the overall configuration of a battery module system according to Embodiment 2.

FIG. 5 is a circuit diagram illustrating the overall configuration of battery module system 10*a* according to the present embodiment. As illustrated in FIG. 5, battery module system 10*a* according to the present embodiment includes first battery module 21, second battery module 22, busbar 23, first RC filters 411 through 413 and 421 through 423, second RC filters 511 through 513 and 521 through 523, and voltage measurement device 12*a*.

Voltage measurement device 12*a* according to the present embodiment includes first measurement circuit 31, second measurement circuit 32, switch circuit 34, correction circuit 33, switch control circuit 35, memory circuit 36, and diagnostic circuit 37, just like voltage measurement device 12 according to Embodiment 1. In the present embodiment, voltage measurement device 12*a* further includes first average filter 61 and second average filter 62.

First average filter 61 is a filter that averages, over time, measurement values measured by first measurement circuit 31. First average filter 61 averages, over time, signals corresponding to the measurement values of each channel measured by first measurement circuit 31. For example, a low-pass filter can be used as first average filter 61. The output signal from first measurement circuit 31 is input to first average filter 61, and the averaged signal is output as a measurement value. The measurement value is input to diagnostic circuit 37.

Second average filter 62 is a filter that averages, over time, measurement values measured by second measurement circuit 32. Second average filter 62 averages, over time, signals corresponding to the measurement values of each channel measured by second measurement circuit 32. For example, a low-pass filter can be used as second average filter 62. The output signal from second measurement circuit 32 is input to second average filter 62, and the averaged signal is output as a measurement value. The measurement value is input to correction circuit 33.

The voltages between both ends of each battery cell and busbar 23 in battery module system 10*a* according to the present embodiment fluctuate due to fluctuations in the discharge current output by each battery module. The measurement values measured by first measurement circuit 31 and second measurement circuit 32 will therefore also fluctuate. In the present embodiment, first average filter 61 and second average filter 62 can inhibit fluctuations in measurement values by averaging the measurement values over time. This makes more accurate voltage measurement possible.

In the present embodiment, by adjusting the filtering characteristics of each of first average filter 61 and second average filter 62, the combined filtering characteristics of first RC filters 411 through 413 and 421 through 423, first measurement circuit 31, and first average filter 61 and the combined filtering characteristics of second RC filters 511 through 513 and 521 through 523, second measurement circuit 32, and second average filter 62 are made similar. Stated differently, the difference between the combined filtering characteristics of first RC filters 411 through 413 and 421 through 423, first measurement circuit 31, and first average filter 61 and the combined filtering characteristics of second RC filters 511 through 513 and 521 through 523, second measurement circuit 32, and second average filter 62 is lower than the difference between the combined filtering characteristics of first RC filters 411 through 413 and 421 through 423 and first measurement circuit 31 and the combined filtering characteristics of second RC filters 511 through 513 and 521 through 523 and second measurement circuit 32.

This enables highly accurate voltage measurement and voltage correction since the fluctuation characteristics of the measurement values output from first average filter 61 and second average filter 62 can be aligned.

Embodiment 3

The voltage measurement device and the battery module system according to Embodiment 3 will be described. The voltage measurement device and battery module system according to the present embodiment differs from the voltage measurement device and battery module system according to Embodiment 1 mainly in regard to how the cell balance switches and the like are connected. Hereinafter, the voltage measurement device and the battery module system according to the present embodiment will be described, focusing on the differences from voltage measurement device 12 and battery module system 10 according to Embodiment 1.

3-1. Overall Configuration

Figure 6:
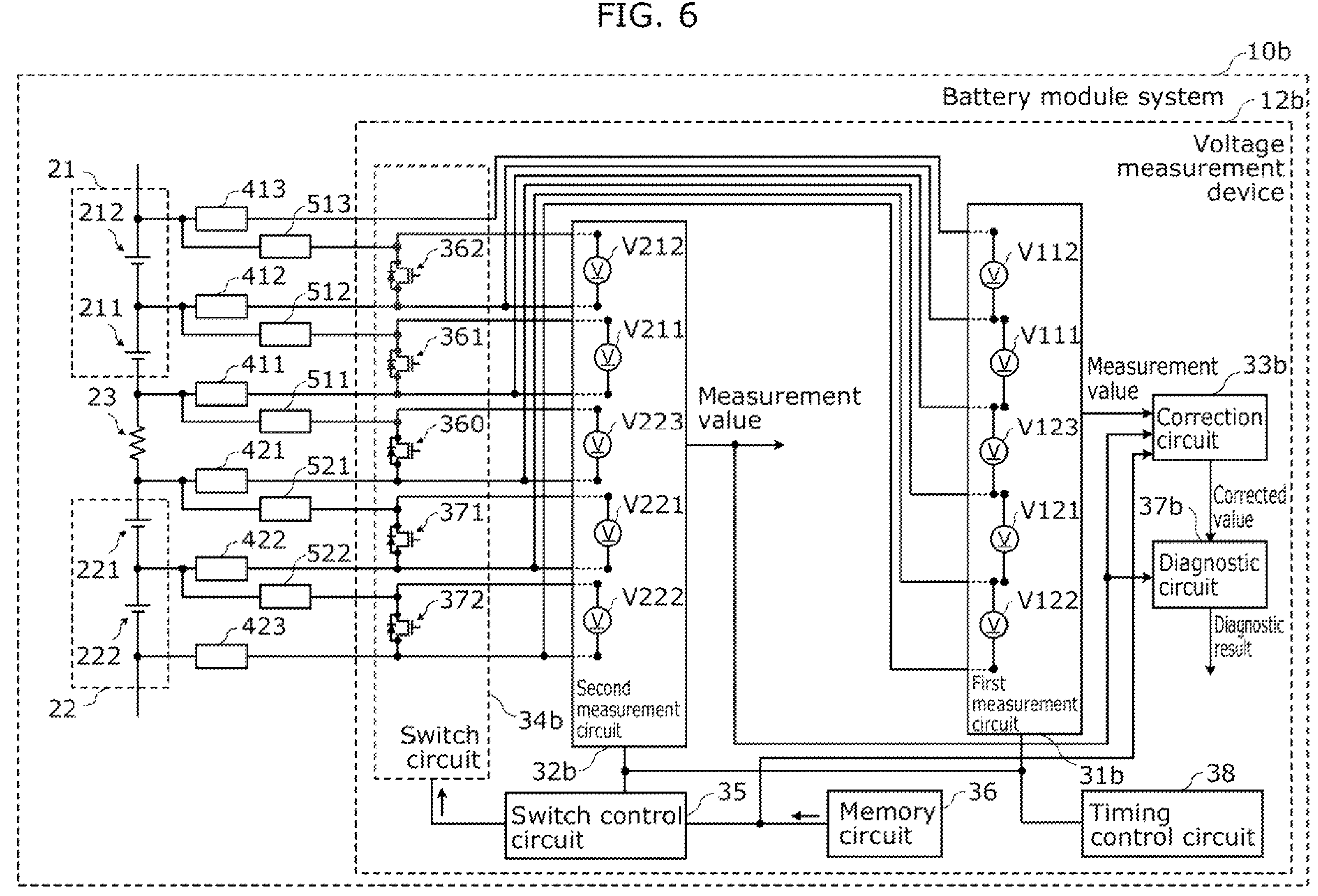
FIG. 6 is a circuit diagram illustrating the overall configuration of a battery module system according to Embodiment 3.

The overall configuration of the battery module system including the voltage measurement device according to the present embodiment will be described with reference to FIG. 6. FIG. 6 is a circuit diagram illustrating the overall configuration of battery module system 10*b* according to the present embodiment. As illustrated in FIG. 6, battery module system includes first battery module 21, second battery module 22, busbar 23, first RC filters 411 through 413 and 421 through 423, second RC filters 511 through 513 and 521 through 522, and voltage measurement device 12*b*.

As illustrated in FIG. 6, in the present embodiment as well, just as in battery module system 10 according to Embodiment 1, a different one of first RC filters 411 through 413 and 421 through 423 is connected to each of the anodes of first battery cells 211 and 212 and second battery cells 221 and 222, as well as each of the connection points between busbar 23 and first battery module 21. Moreover, a different one of second RC filters 511 through 513, 521, and 522 is connected to each of the cathodes of first battery cells 211 and 212 and second battery cells 221 and 222, as well as each of the connection points between busbar 23 and second battery module 22.

Voltage measurement device 12*b* includes first measurement circuit 31*b*, second measurement circuit 32*b*, switch circuit 34*b*, and correction circuit 33*b*. In the present embodiment, voltage measurement device 12*b* further includes switch control circuit 35, memory circuit 36, diagnostic circuit 37*b*, and timing control circuit 38.

First measurement circuit 31*b* is a circuit that measures the voltage between both ends of each of first battery cells 211 and 212, busbar 23, and second battery cells 221 and 222. First measurement circuit 31*b* is connected to first battery cells 211 and 212, busbar 23, and second battery cells 221 and 222 via the first RC filters 411 through 413 and 421 through 423.

Second measurement circuit 32*b* is a circuit that measures the voltage between both ends of each of first battery cells 211 and 212, busbar 23, and second battery cells 221 and 222. Second measurement circuit 32 is connected to first battery cells 211 and 212, busbar 23, and second battery cells 221 and 222 via first RC filters 411, 412, and 421 through 423 and second RC filters 511 through 513, 521, and 522.

Switch circuit 34*b* includes cell balance switches 360 through 362, 371, and 372. Each cell balance switch is controlled by switch control circuit 35. In the present embodiment, cell balance switch 360 is connected in parallel with busbar 23 via second RC filter 511 connected to the connection point between busbar 23 and first battery module 21, and first RC filter 421 connected to the connection point between busbar 23 and second battery module 22. Cell balance switch 361 is connected in parallel with first battery cell 211 via second RC filter 512 and first RC filter 411, which are connected to first battery cell 211. Cell balance switch 362 is connected in parallel with first battery cell 212 via second RC filter 513 and first RC filter 412, which are connected to first battery cell 212.

Cell balance switch 371 is connected in parallel with second battery cell 221 via second RC filter 521 and first RC filter 422, which are connected to second battery cell 221. Cell balance switch 372 is connected in parallel with second battery cell 222 via second RC filter 522 and first RC filter 423, which are connected to second battery cell 222.

By connecting cell balance switches 360 through 362, 371, and 372 to first battery module 21 and second battery module 22 in the manner described above, the direct connection of adjacent cell balance switches can be avoided. For example, if a plurality of cell balance switches are directly connected and they are all kept in the on state, if both ends of each battery cell connected to them are short circuited and connected, large current from the high-voltage stacked battery cells flows through the plurality of cell balance switches, and since there is concern that this will destroy the cell balance switches, the cell balance switches can only be turned on every other cell. In the present embodiment, since adjacent cell balance switches are not directly connected, high current can be prevented from flowing to the cell balance switches, and all battery cells can be equalized at the same time. This makes equalization in a short amount of time possible.

Correction circuit 33*b* corrects measurement values measured by first measurement circuit 31*b*. More specifically, correction circuit 33*b* corrects a measurement value measured by first measurement circuit 31*b* using a measurement value of the voltage between both ends of busbar 23 measured by first measurement circuit 31*b*. Details regarding the correction method will be described later.

Diagnostic circuit 37*b* is a circuit that compares the measurement value corrected by correction circuit 33 (i.e., the corrected value) and a measurement value measured by second measurement circuit 32*b*. Diagnostic circuit 37*b* outputs a diagnostic result based on the comparison.

Switch control circuit 35, memory circuit 36, and timing control circuit 38 of voltage measurement device 12*b* have the same configuration as switch control circuit 35, memory circuit 36, and timing control circuit 38 according to Embodiment 1, respectively.

3-2. Measurement Value Correction Method

Next, the method of correcting the measurement value of the voltage between both ends of each battery cell in voltage measurement device 12*b* according to the present embodiment will be described.

As mentioned above, because busbar 23 includes a resistive component, when current flows through each battery module and busbar 23, a voltage drop occurs in busbar 23. Voltage is therefore applied to first RC filter 421, as well as cell balance switch 360 and second RC filter 511, which are connected in parallel with busbar 23. Accordingly, current flows through first RC filter 421, the body diode of cell balance switch 360, and second RC filter 511. This causes a voltage drop in first resistor 40*r* of first RC filter 421 and second resistor 50*r* of second RC filter 511.

Here, first RC filter 421 is included in the circuit used for the measurement by first measurement circuit 31*b* of the voltage between both ends of second battery cell 221 that is directly connected to busbar 23. This results in an error in the measurement value of the voltage of second battery cell 221 (measurement value V121 illustrated in FIG. 6) due to the voltage drop in first resistor 40*r* of first RC filter 421.

The measurement values of other battery cells measured by first measurement circuit 31*b* (measurement values V111, V112, and V122 illustrated in FIG. 6) and the measurement values of battery cells measured by second measurement circuit 32*b* (measurement values V211, V212, V221, and V222 illustrated in FIG. 6) do not contain errors.

In the present embodiment, measurement values measured by first measurement circuit 31*b* are corrected by correction circuit 33*b*. As mentioned above, measurement value V121 of the voltage between both ends of second battery cell 221 is measured by first measurement circuit 31*b* to be lower than the actual voltage value V21 between both ends of second battery cell 221 by the amount of voltage drop V421 in first resistor 40*r* of first RC filter 421. Here, voltage drop V421 is defined as a positive value when the electric potential is higher on the voltage measurement device 12*b* side than on the anode side of second battery cell 221 to which first RC filter 421 is connected, and a negative value when the electric potential is lower on the voltage measurement device 12*b* side than on the anode side of second battery cell 221. In the present embodiment, voltage drop V421 is a negative value.

Therefore, the following equation holds true between measurement value V121 of the voltage between both ends of second battery cell 221 in first measurement circuit 31*b*, actual voltage value V21 between both ends of second battery cell 221, and voltage drop V421.

$$V121 = V21 - V421$$

The following equation holds true between measurement value V123 of the voltage between both ends of busbar 23 in first measurement circuit 31*b* and actual voltage value V23 between both ends of busbar 23.

$$V123 = V23 - V421$$

The following equation holds true between measurement value V223 of the voltage between both ends of busbar 23 in second measurement circuit 32*b* and actual voltage value V23 between both ends of busbar 23.

$$V223 = V23 - V421 - V511$$

Here, by making the respective resistance values of first resistor 40*r* of first RC filter 421 and second resistor 50*r* of second RC filter 521 equal, voltage drop V421 and voltage drop V511 become equal. Accordingly, voltage value V21 is expressed by the following equation.

$$V11 = V211 + V223 - V123$$

Correction circuit 33*b* uses these relational expressions to calculate the corrected value of measurement value V121.

As described above, according to the present embodiment, correction circuit 33*b* calculates correction amount (V223–V123) based on measurement value V123 of the voltage between both ends of busbar 23 measured by first measurement circuit 31*b* and measurement value V223 of the voltage between both ends of the busbar measured by second measurement circuit 32*b*. Correction circuit 33*b* adds the correction amount to the measurement values measured by first measurement circuit 31*b*, of the voltage between both ends of second battery cell 221, which is the second battery cell that is directly connected to busbar 23 among second battery cells 221 and 222. The configuration of correction circuit 33*b* is not limited to this example. For example, correction circuit 33*b* may set the correction amount as (V123–V223) (i.e., invert the sign of the correction amount) and subtract (instead of add) the correction amount to the measurement value measured by first measurement circuit 31*b*.

As described above, voltage measurement device 12*b* according to the present embodiment can accurately measure the voltage of second battery cell 221 that is directly connected to busbar 23 by using correction circuit 33*b* to correct the measurement value measured by first measurement circuit 31*b*.

In the present embodiment as well, just as in Embodiment 1, cell balance switch 360, which is connected in parallel with busbar 23, may be kept in the on state by switch control circuit 35. This inhibits current from flowing through the body diode of cell balance switch 360, thereby inhibiting the destruction of cell balance switch 360 by this current.

Thus, when cell balance switch 360 is kept in the on state, measurement value V223 measured by second measurement circuit 32*b* can be ignored if the resistive component in cell balance switch 360 is small enough to be ignored. Accordingly, in this case, V21 is expressed by the following equation.

$$V21 = V221 - V123$$

Correction circuit 33*b* may use this relational expression to calculate the corrected value of measurement value V121. Stated differently, correction circuit 33*b* may calculate the correction amount (—V123) based on the measurement value of the voltage between both ends of busbar 23 measured by first measurement circuit 31*b*. This allows for simpler correction.

Variations, Etc.

Although the present disclosure has been described based on the above embodiments, the present disclosure is not limited to the above embodiments.

For example, in each of the above embodiments, the battery module system includes two battery modules and one busbar, but the battery module system may include three or more battery modules and two or more busbars.

In each of the above embodiments, each battery module includes two battery cells, but each battery module may include three or more battery cells.

In each of the above embodiments, the correction circuit corrects both of the measurement values of the voltage between both ends of first battery cell 211 and the voltage between both ends of second battery cell 221, but it is sufficient if the correction circuit corrects at least one of them.

In each of the above embodiments, the voltage measurement device includes memory circuit 36 and diagnostic circuit 37, but the voltage measurement device need not include at least one of memory circuit 36 and diagnostic circuit 37.

The battery module system according to each of the above embodiments may be housed in, for example, a single housing, and, alternatively, may be separated into a plurality of housings.

Some or all of the elements included in the voltage measurement device and the battery module system according to the above embodiments may be configured in the form of a single system Large Scale Integration (LSI) chip. A system LSI circuit is a super multifunctional LSI chip manufactured by integrating a plurality of elements on a single chip. More specifically, a system LSI chip is, for example, a computer system including a microprocessor, ROM, RAM, etc. The RAM stores a computer program. The functions of the system LSI chip are realized by the microprocessor operating according to the computer program.

Various modifications of the above embodiments that may be conceived by those skilled in the art, as well as embodiments resulting from arbitrary combinations of elements and functions from different embodiments that do not depart from the essence of the present disclosure are included the present disclosure.

For example, first average filter 61 that averages, over time, measurement values measured by first measurement circuit 31*b* and second average filter 62 that averages, over time, measurement values measured by second measurement circuit 32*b* may be applied to voltage measurement device 12*b* according to Embodiment 3, just like voltage measurement device 12*a* according to Embodiment 2.

INDUSTRIAL APPLICABILITY

The voltage measurement device according to the present disclosure can be used, for example, as a voltage measurement device for an in-vehicle battery module system.

The invention claimed is:

1. A voltage measurement device for use in a battery module system, the battery module system including:
- a first battery module including a plurality of first battery cells connected in series;
- a busbar connected in series with the first battery module, the busbar comprising a resistance;
- a second battery module connected in series with the first battery module via the busbar and including a plurality of second battery cells connected in series; and
- a plurality of first RC filters and a plurality of second RC filters connected to at least one of the first battery module, the busbar, or the second battery module, the voltage measurement device comprising:
- a first measurement circuit that measures voltage between both ends of the busbar;
- a second measurement circuit that measures voltage between both ends of each of the plurality of first battery cells and the plurality of second battery cells; and
- a correction circuit that corrects a measurement value measured by the second measurement circuit, wherein
- the second measurement circuit is connected to the plurality of first battery cells, the busbar, and the plurality of second battery cells via the plurality of second RC filters, and
- the correction circuit corrects a measurement value measured by the second measurement circuit using a measurement value of voltage between both ends of the busbar measured by the first measurement circuit.

2. The voltage measurement device according to claim 1, wherein
- a different one of the plurality of first RC filters and a different one of the plurality of second RC filters are connected to each of connection points between the plurality of first battery cells, the busbar, and the plurality of second battery cells, which are connected in series.

3. The voltage measurement device according to claim 1, wherein
- the first measurement circuit is connected to the plurality of first battery cells, the busbar, and the plurality of second battery cells via the plurality of first RC filters.

4. The voltage measurement device according to claim 1, comprising:
- a cell balance switch connected in parallel with the busbar via two second RC filters, among the plurality of second RC filters, that are connected to the busbar.

5. The voltage measurement device according to claim 4, further comprising:
- a switch control circuit configured to keep the cell balance switch in an on state.

6. The voltage measurement device according to claim 1, wherein
- at least one of the first measurement circuit or the second measurement circuit detects a position at which the busbar is connected based on measurement values of voltage between both ends of each of the plurality of first battery cells, the busbar, and the plurality of second battery cells.

7. The voltage measurement device according to claim 1, further comprising:
- a timing control circuit that synchronizes a timing at which the first measurement circuit measures voltage between both ends of the busbar and at least one of (i) a timing at which the second measurement circuit measures voltage between both ends of a first battery cell, among the plurality of first battery cells, that is directly connected to the busbar, or (ii) a timing at which the second measurement circuit measures voltage between both ends of a second battery cell, among the plurality of second battery cells, that is directly connected to the busbar.

8. The voltage measurement device according to claim 1, further comprising:

a diagnostic circuit that compares a measurement value measured by the first measurement circuit and a measurement value corrected by the correction circuit.

9. The voltage measurement device according to claim 1, further comprising:

a first average filter that averages, over time, measurement values measured by first measurement circuit; and a second average filter that averages, over time, measurement values measured by second measurement circuit.

10. The voltage measurement device according to claim 9, wherein a difference between a combined filtering characteristic of the plurality of first RC filters, the first measurement circuit, and the first average filter and a combined filtering characteristic of the plurality of second RC filters, the second measurement circuit, and the second average filter is lower than a difference between a combined filtering characteristic of the plurality of first RC filters and the first measurement circuit and a combined filtering characteristic of the plurality of second RC filters and the second measurement circuit.

11. The voltage measurement device according to claim 1, wherein the correction circuit:

calculates a correction amount based on the measurement value of voltage between both ends of the busbar measured by the first measurement circuit; and adds or subtracts the correction amount to or from a measurement value measured by the second measurement circuit of at least one of voltage between both ends of a first battery cell, among the plurality of first battery cells, that is directly connected to the busbar or voltage between both ends of a second battery cell, among the plurality of second battery cells, that is directly connected to the busbar.

12. The voltage measurement device according to claim 11, wherein the second measurement circuit measures voltage between both ends of the busbar, and the correction circuit calculates the correction amount based on the measurement value of voltage between both ends of the busbar measured by the first measurement circuit and a measurement value of voltage between both ends of the busbar measured by the second measurement circuit.

13. A voltage measurement device for use in a battery module system, the battery module system including:

a first battery module including a plurality of first battery cells connected in series;

a busbar connected in series with the first battery module, the busbar comprising a resistance;

a second battery module connected in series with the first battery module via the busbar and including a plurality of second battery cells connected in series; and a plurality of first RC filters and a plurality of second RC filters connected to at least one of the first battery module, the busbar, or the second battery module, the voltage measurement device comprising:

a first measurement circuit that measures voltage between both ends of each of the plurality of first battery cells, the busbar, and the plurality of second battery cells;

a second measurement circuit that measures voltage between both ends of each of the plurality of first battery cells, the busbar, and the plurality of second battery cells; and a correction circuit that corrects a measurement value measured by the first measurement circuit, wherein a different one of the plurality of first RC filters is connected to each of anodes of the plurality of first battery cells and the plurality of second battery cells and each of connection points between the busbar and the first battery module, a different one of the plurality of second RC filters is connected to each of cathodes of the plurality of first battery cells and the plurality of second battery cells and each of connection points between the busbar and the second battery module, the first measurement circuit is connected to the plurality of first battery cells, the busbar, and the plurality of second battery cells via the plurality of first RC filters, and the correction circuit corrects a measurement value measured by the first measurement circuit using a measurement value of voltage between both ends of the busbar measured by the first measurement circuit.

14. The voltage measurement device according to claim 13, wherein the second measurement circuit is connected to the plurality of first battery cells, the busbar, and the plurality of second battery cells via the plurality of first RC filters and the plurality of second RC filters.

15. The voltage measurement device according to claim 13, comprising:

a cell balance switch connected in parallel with the busbar via a second RC filter, among the plurality of second RC filters, that is connected to a connection point between the busbar and the first battery module, and a first RC filter, among the plurality of first RC filters, that is connected to a connection point between the busbar and the second battery module.

16. The voltage measurement device according to claim 15, further comprising:

a switch control circuit configured to keep the cell balance switch in an on state.

17. The voltage measurement device according to claim 13, wherein at least one of the first measurement circuit or the second measurement circuit detects a position at which the busbar is connected based on measurement values of voltage between both ends of each of the plurality of first battery cells, the busbar, and the plurality of second battery cells.

18. The voltage measurement device according to claim 13, further comprising:

a timing control circuit that synchronizes a timing at which the first measurement circuit measures voltage between both ends of the busbar and at least one of (i) a timing at which the second measurement circuit measures voltage between both ends of a first battery cell, among the plurality of first battery cells, that is directly connected to the busbar, or (ii) a timing at which the second measurement circuit measures voltage between both ends of a second battery cell, among the plurality of second battery cells, that is directly connected to the busbar.

19. The voltage measurement device according to claim 13, further comprising:

a diagnostic circuit that compares a measurement value corrected by the correction circuit and a measurement value measured by the second measurement circuit.

20. The voltage measurement device according to claim 13, further comprising:

a first average filter that averages, over time, measurement values measured by first measurement circuit; and a second average filter that averages, over time, measurement values measured by second measurement circuit.

21. The voltage measurement device according to claim 20, wherein a difference between a combined filtering characteristic of the plurality of first RC filters, the first measurement circuit, and the first average filter and a combined filtering characteristic of the plurality of first RC filters, the plurality of second RC filters, the second measurement circuit, and the second average filter is lower than a difference between a combined filtering characteristic of the plurality of first RC filters and the first measurement circuit and a combined filtering characteristic of the plurality of first RC filters, the plurality of second RC filters and the second measurement circuit.

22. The voltage measurement device according to claim 13, wherein the correction circuit:

calculates a correction amount based on the measurement value of voltage between both ends of the busbar measured by the first measurement circuit and a measurement value of voltage between both ends of the busbar measured by the second measurement circuit; and adds or subtracts the correction amount to or from a measurement value measured by the first measurement circuit of voltage between both ends of a second battery cell, among the plurality of second battery cells, that is directly connected to the busbar.

* * * * *